(12) United States Patent
Lee

(10) Patent No.: US 6,509,644 B2
(45) Date of Patent: Jan. 21, 2003

(54) GRID ARRAY PACKAGE WITH REDUCED POWER AND GROUND IMPEDANCE UNDER HIGH FREQUENCY

(75) Inventor: Chun-Ho Lee, Taipei (TW)

(73) Assignee: VIA Technologies Inc., Hsin Tien (TW)

( * ) Notice: Subject to any disclaimer, the term of this patent is extended or adjusted under 35 U.S.C. 154(b) by 12 days.

(21) Appl. No.: 09/858,651

(22) Filed: May 17, 2001

(65) Prior Publication Data

US 2001/0042914 A1 Nov. 22, 2001

(30) Foreign Application Priority Data

May 22, 2000 (TW) ...................................... 089109870 A

(51) Int. Cl.$^7$ .............................................. H01L 23/34
(52) U.S. Cl. ....................... 257/728; 257/688; 257/691; 257/693; 257/698; 257/730; 257/738; 257/773; 257/774; 257/775
(58) Field of Search ................................. 257/728, 688, 257/691, 693, 698, 730, 738, 773, 774, 775

(56) References Cited

U.S. PATENT DOCUMENTS

| | | | | |
|---|---|---|---|---|
| 4,875,087 A | * | 10/1989 | Miyauchi et al. | ........... 257/664 |
| 5,426,319 A | * | 6/1995 | Notani | ......................... 257/275 |
| 5,490,324 A | * | 2/1996 | Newman | ................... 174/52.4 |
| 5,741,729 A | * | 4/1998 | Selna | .......................... 438/125 |
| 5,952,709 A | * | 9/1999 | Kitazawa et al. | ............ 257/275 |
| 6,215,377 B1 | * | 4/2001 | Douriet | ....................... 257/728 |
| 6,356,173 B1 | * | 3/2002 | Nagata et al. | ............... 257/664 |
| 6,365,975 B1 | * | 4/2002 | DiStefano et al. | ........... 257/685 |
| 6,400,576 B1 | * | 6/2002 | Davidson | ..................... 174/262 |

FOREIGN PATENT DOCUMENTS

| JP | 06236935 | * | 8/1994 | .................. 257/659 |
|---|---|---|---|---|

* cited by examiner

Primary Examiner—Sheila V. Clark
Assistant Examiner—Eugene Lee
(74) Attorney, Agent, or Firm—Winston Hsu

(57) ABSTRACT

A grid array (GA) package for holding a die therein, the die accessing its operational power from a printed circuit board through the GA package, the GA package comprises a substrate with a die cavity. A first conductive layer is provided on a top surface of the substrate, a ring is provided surrounding the die cavity whereby the die electrically connects the first conductive layer via the ring. A second conductive layer is provided on a bottom surface of the substrate. A plurality of vias are provided within the substrate to connect the first conductive layer with the second conductive layer. A plurality of solder balls are provided on the bottom surface of the second conductive layer to connect the second conductive layer with the printed circuit board. Individual solder ball is horizontally closer to the die cavity in comparison with at least one associated via. Therefore when power transfers from individual solder ball through the second conductive layer, at least one associated via, the first conductive layer, and the ring, finally to the die. The direction of current that flow through the second conductive layer is opposite to the direction of current that flow through the first conductive layer, so as that the magnetic field produced by the current flow through the second conductive layer cancels out the magnetic field produced by the current flow through the first conductive layer, to decrease the power and ground impedance of the substrate.

11 Claims, 4 Drawing Sheets

|  | Power resistance (mΩ) | Power inductance (mH) | Power impedance (mΩ) |
|---|---|---|---|
| BGA substrate of prior art | 3.97 | 0.81 | 0.51 |
| BGA substrate of the present invention | 4.23 | 0.59 | 0.37 |

GRID ARRAY PACKAGE WITH REDUCED POWER AND GROUND IMPEDANCE UNDER HIGH FREQUENCY

BACKGROUND OF THE INVENTION

1. Field of the Invention

The present invention relates to a grid array substrate, and more specifically, to a grid array with reduced power and ground impedance under high frequency.

2. Description of the Prior Art

The higher operation speed of an IC(Integrated Circuit) leads to a higher impedance of circuit which may result in both signal distortion and lag. Therefore, the spatial layout of a circuit needs to be considered in order to lower the impedance of a package.

Please refer to FIG. 1. FIG. 1 shows a diagram of a conventional ball grid array (BGA) package 10 for holding a die 12. The die 12 obtains the required power from a printed circuit board (not shown) through the BGA package 10.

The BGA package 10 comprises a substrate 14, a recessed die cavity 16 installed on the substrate 14 for holding the die 12, a top power plane 18 provided on the top surface of the substrate 14 and located adjacent to the periphery of the recessed die cavity 16, and a power ring 20 plated with Ni and Au for wire bonding, which is located on the top edge of the top power plane. The die 12 is connected to the power ring 20 through a plurality of bond wires 22. A bottom power plane 24 is provided on the bottom surface of the substrate 12, and connected to the top power plane 18 through a via 26 provided within the substrate 14. A plurality of solder balls 28 provided on the bottom surface of the bottom power plane 24 electrically connect the printed circuit board to the bottom power plane 24. Many signal traces with radiated arrangement (not shown) are provided adjacent to outer edge of the power plane 18.

In the prior art BGA package 10, the power travels in an order through the solder balls 28, the second conductive layer 24, the circuit via 26, the first conductive layer 18, the power ring 20, the bond wires 22 and finally to the die 12. Since the total impedance Z=R+jωL, the decrease in the value of the resistance leads to an overall reduction in the value of the impedance. In order to lower the resistance produced during power transfer, the shortest route is taken whereby the via 26 is located closer to the recessed die cavity 16 than the solder balls 28.

The above route keeps the resistance low but ineffectively reduces the inductance. During the high frequency operation range, inductance dominates the total impedance (Z=R+jωL). High impedance will cause phenomena such as power bounce and voltage degradation, without achieving the packaging requirement of both high speed and high density.

SUMMARY OF THE INVENTION

It is an object of the present invention to provide a grid array package with reduced impedance under high frequency to solve the above-mentioned problem.

In accordance with the claimed invention, the present invention provides a ball grid array package (and can be applied to other types of grid array substrate such as PGA) to hold a die, wherein the die accesses its operational power from a printed circuit board through the BGA package. The BGA package comprises a substrate, with a recessed die cavity installed on the substrate for holding the die. A first conductive layer is provided on the top surface of the substrate, and is located adjacent to the periphery of the recessed die cavity. A power ring is also located adjacent to the periphery of the recessed cavity to connect the first conductive layer to the recessed die cavity. A second conductive layer is provided on the bottom surface of the substrate. A plurality of vias provided within the substrate connect the first conductive layer to the second conductive layer. A plurality of solder balls are provided on the bottom surface of the second conductive layer to connect the printed circuit board to the second conductive layer. The solder balls locate closer to the recessed die cavity than the via. Power is transferred in an order through the solder balls, the second conductive layer, the circuit via, the first conductive layer, the power ring and finally to the die. The direction of current flow through the second conductive layer is opposite to that through the first conductive layer. The opposing directions of the current flow result in the cancellation of the magnetic fields produced by the current flows through the conductive layers, so as to significantly decrease the impedance of the substrate.

It is an advantage of the present invention that the opposing directions of current flows through the conductive layers cancel out the magnetic fields produced. The effect results in a sharp decrease in impedance to remove the effects of both power bounce and power degradation.

These and other objectives of the present invention will become obvious to those of ordinary skill in the art after reading the following detailed description of the preferred embodiments accompanied with the drawings.

DETAILED DESCRIPTION OF THE PREFERRED EMBODIMENT

Figure 2:
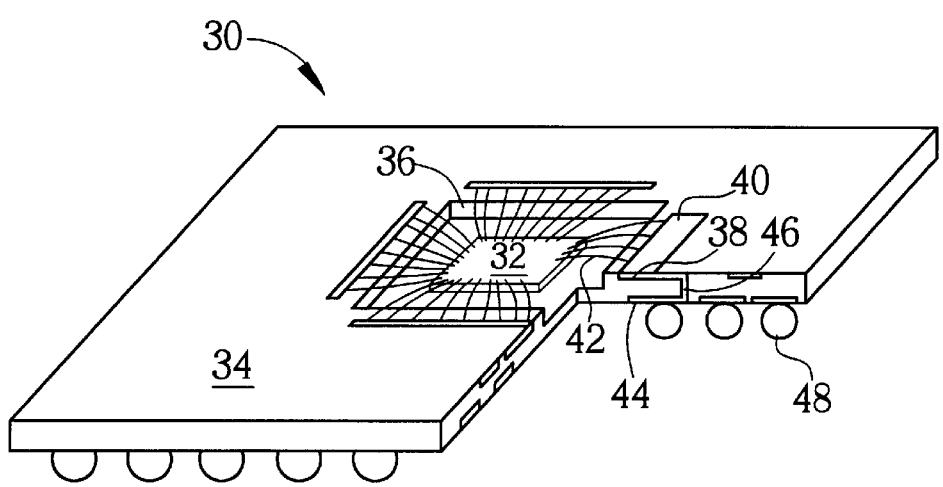
FIG. 2 is a schematic diagram of a BGA package according to the present invention.

Please refer to FIG. 2. FIG. 2 is a schematic diagram of a BGA package 30 according to the present invention. The BGA package 30 (and can be applied to other types of grid array such as PGA) holds a die 32 within, the die 32 accesses its operational power from a printed circuit board(not shown) through the BGA substrate. The BGA package 30 can utilize a two-layered or multi-layered substrate structure. Descriptions herein is primarily for a BGA package 30 with two-layered substrate; but a four-layered or multi-layered substrate can also be applied to a BGA substrate with the present invention.

The BGA package 30 comprises a substrate 34, with a recessed die cavity 36 installed on the substrate 34 for holding the die 32. A conductive layer 38, installed on the top surface of the substrate 34, functions as a power plane. A power ring 40 is also installed adjacent to the periphery of the recessed die cavity 36. A plurality of bond wires 42 connect the die 32 to both the power ring 40 and the conductive layer 38. A conductive layer 44, installed on the bottom surface of the substrate 34, connects the conductive layer 38 through a plurality of vias 46 provided within the substrate 34. Besides, a plurality of solder balls 48 provided on the bottom surface of the conductive layer 44 connect the conductive layer 44 to the printed circuit board.

In comparison with the circuit layout of the prior art, the layout of the present invention places each solder ball 48 closer to the recessed die cavity 36 than the associated via 46. The power supply for the BGA package 30 is transported in an order through the solder balls 48, the conductive layer 44, the vias 46, the conductive layer 38, the power ring 40 and finally to the die 32. At this point, the direction of current flow through the conductive layer 44 is opposite to that through the conductive layer 38. Therefore, the opposing directions of current flows on the conductive layers 38,44 cancel out the corresponding induced magnetic fields, consequently decreasing the impedance of the BGA package 30.

Figure 3A:
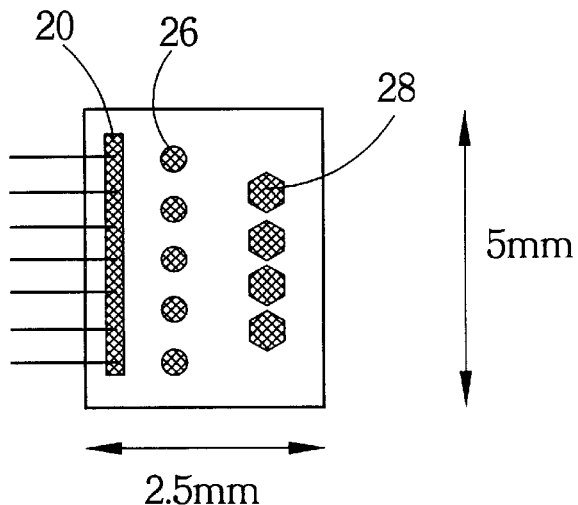
FIG. 3 is a schematic diagram of a model of a BGA package according to the prior art.
Figure 3B:
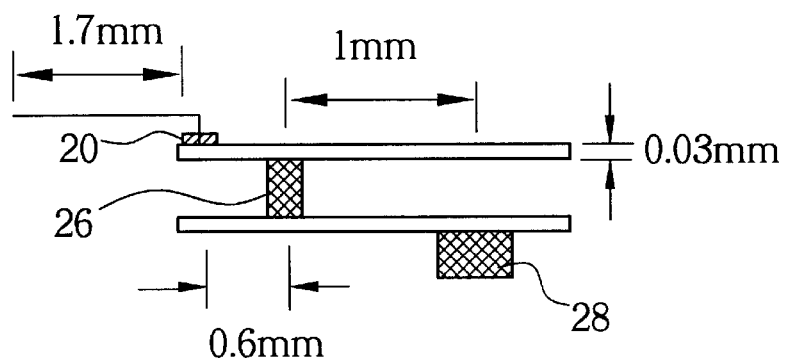
Figure 3C:
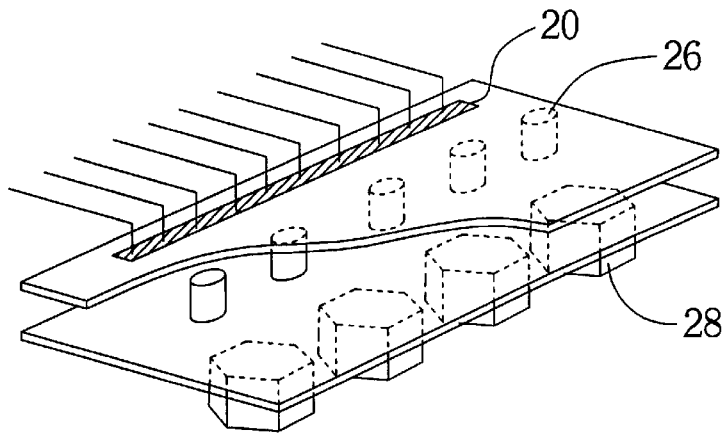
Figure 4A:
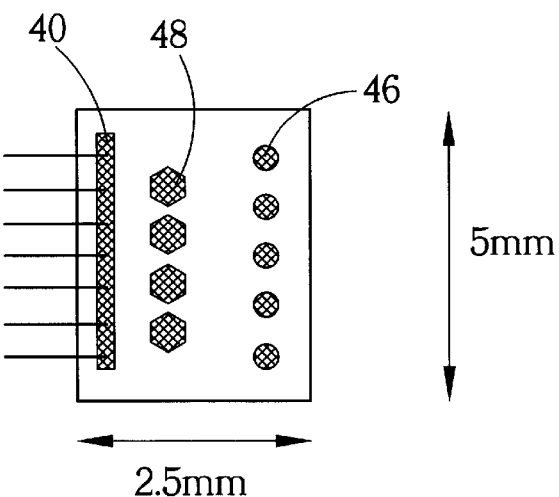
FIG. 4 is a schematic diagram of a model of a BGA package according to the present invention.
Figure 4B:
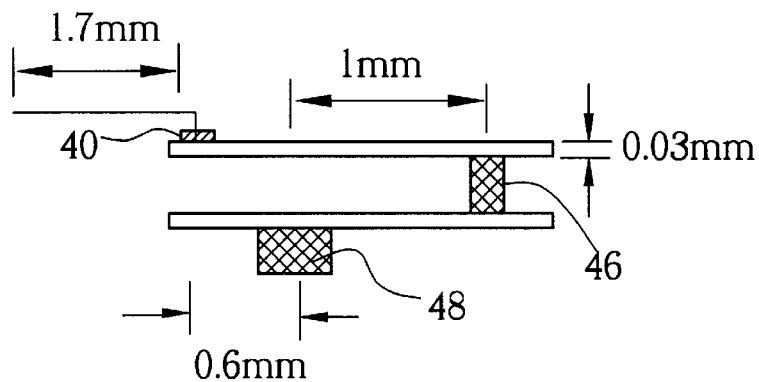
Figure 4C:
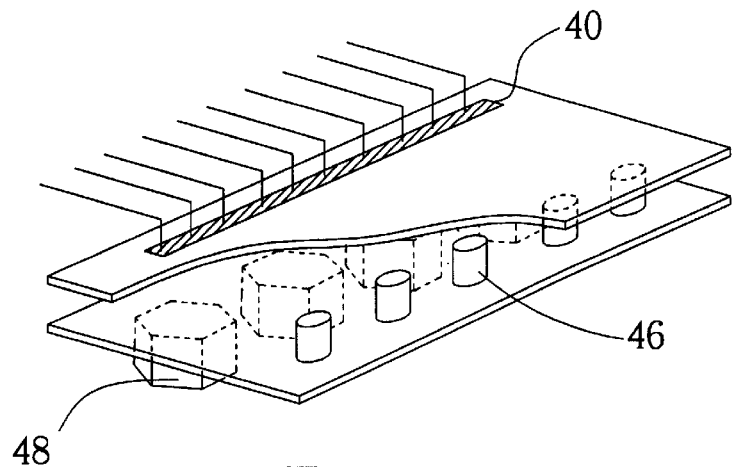
Figures 5, 6:
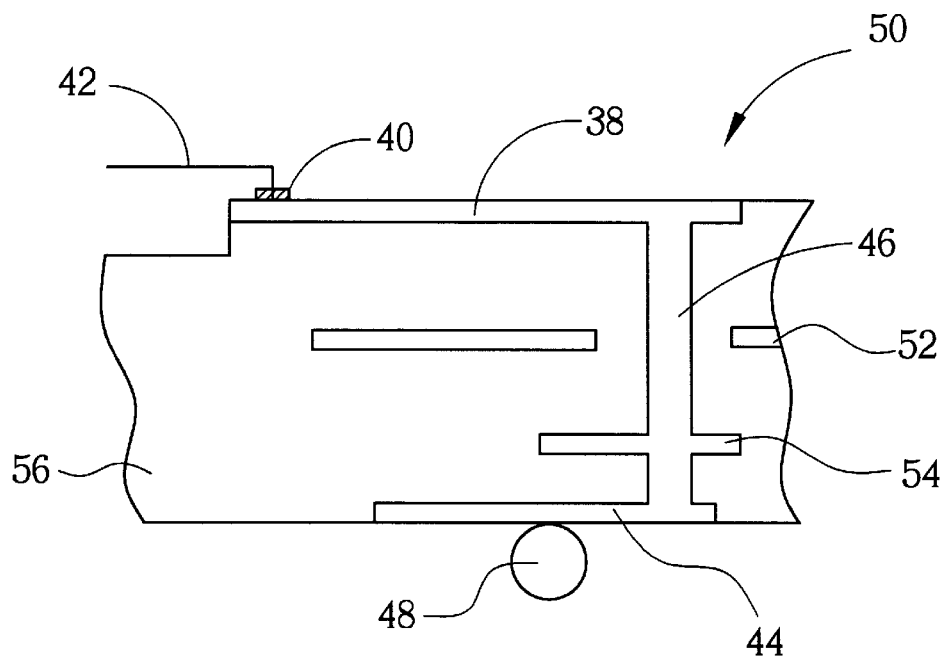
FIG. 5 is a table list of the simulated result for the models shown in FIG. 3 and FIG. 4.
FIG. 6 is a schematic diagram of the second preferred embodiment of a BGA package according to the present invention.

Please refer to FIG. 3 to FIG. 5. FIG. 3, including FIGS. 3A to 3C, shows a schematic diagram of a model of a BGA package according to the prior art. FIG. 4, including FIGS. 4A to 4C, shows a schematic diagram of a model of a BGA package according to the present invention. FIG. 5 is a simulated result table of the models of FIG. 3 and FIG. 4. Therefore, simplified circuits are shown in order to calculate their resistance, inductance and impedance.

For these two models, assume that upper and lower metal layers are both 5*2.5 mm² with a thickness of 30 um. There are a total of 24 bond wires (only a portion of the bond wires are shown in the figures). Each bond wire typically has a diameter of 30 um and a length of 1.7 mm. There are 5 vias, each with a diameter of 250 um and a height of 420 um. There are 4 solder balls, each with a diameter of 700 um and a height of 500 um. Moreover, the die operates under a pre-determined internal frequency clock of 100 MHz.

Figure 1:
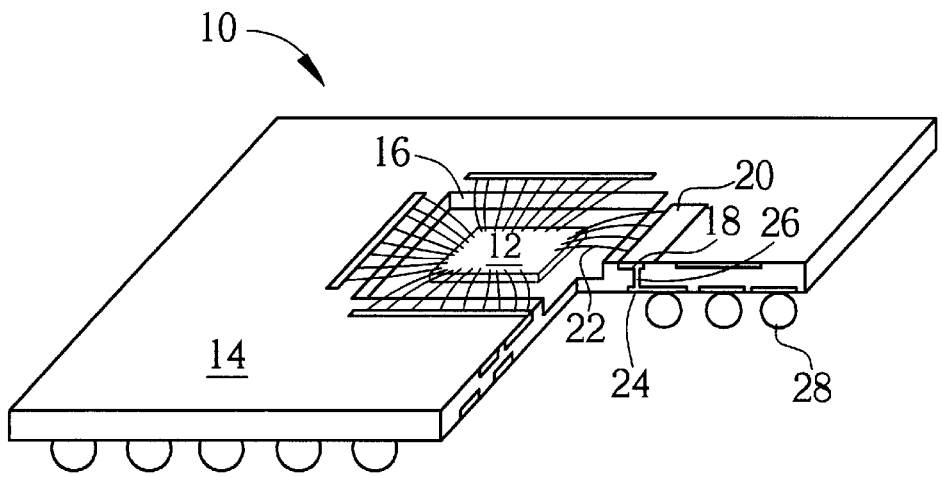
FIG. 1 is a schematic diagram of a BGA package according to the prior art.

FIG. 3 models the relative positioning for vias 26 and solder balls 28 in a BGA package 10 of FIG. 1 according to the prior art. Relative to the site of a recessed die cavity 16, the installation site of a power ring 20 is the closest, followed by the vias 26 and then the solder balls 28. The vias 26 locate approximately 1 mm from the solder balls 28, and are approximately 0.6 mm from the power ring 20 in the horizontal direction. FIG. 4 models the relative positioning for vias 46 and solder balls 48 in a BGA package 30 of FIG. 2 according to the present invention. Relative to the site of a recessed die cavity 36, the installation site of a power ring 40 is the closest, followed by the solder ball 48 and then the vias 46. The solder balls 48 locate between the power ring 40 and the vias 46, and are approximately 1 mm from the vias 46 and approximately 0.6 mm from the power ring 40 in the horizontal direction.

As shown in the results of FIG. 5, the resistance value of the prior art structure is lower than that of the present invention due to a shorter current distance of the prior art structure. However, the inductance value of the structure of the present invention is 27% less than that of the prior art due to the cancellation of magnetic fields in the present invention as a result of opposing current flows respectively on the upper and lower conductive layers. This results in approximate 27% decrease in impedance value for the embodiment of the present invention in comparison with the prior art. For high frequency, the inductance value dominates the total impedance (Z=R+jWL). Therefore, increasing the frequency decreases the effect of resistance and increases the effect of inductance on impedance whereby the greater effect of inductance leads to an overall reduction in impedance for the present invention.

Please refer to FIG. 6. FIG. 6 is a schematic diagram of another preferred embodiment 50 of the present invention. The structure is applicable to a four-layered BGA package 50 whereby its circuit is similar to that of a two-layered BGA package 30, except for the addition of two inner conductive layers 52, 54 within the substrate 56. The inner conductive layer 52 is frequently used as a ground plane while the inner conductive layer 54 is frequently used as a power plane. The via 46 is provided vertically within the substrate 56 and avoids contact with the inner conductive layer 52 (ground plane) while simultaneously connecting with the conductive layer 38, the conductive layer 44 and the conductive layer 54. In the four-layered BGA package 50, the installation site of the solder ball 48 is also located between the via 46 and power ring 40 to lower the impedance of the BGA package 50.

The layout of the BGA package 30 of the present invention provides the solder ball 48 between the power ring 40 and the via 46, making the directions of current flows respectively on the upper and lower conductive layers 38, 44 opposite to one another. The opposing current flows lead to a cancellation of the magnetic fields produced by each conductive layer so as to significantly reduce the overall inductance. The impedance is further decreased under high frequency so that power bounce and voltage degradation phenomenon are both significantly improved.

In contrast to the BGA package 10 of the prior art, the installation site of the solderball 48 of the present invention is located between the power ring 40 and the via 46 in the BGA package 30. Since the opposing current flows respectively on the upper and lower conductive layers 38, 44 cancel out the magnetic fields produced, the impedance of the BGA package 30 is significantly decreased in the present invention comparing with the BGA package 10 in the prior art. As well, both the problems of power bounce and voltage degradation phenomenon are significantly improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A grid array (GA) package for holding a die therein, the die accessing its operational power from a printed circuit board through the GA package, the GA package comprising:

a substrate, with a die cavity for holding the die;

a first conductive layer provided on a top surface of the substrate;

at least one ring surrounding the die cavity whereby the die electrically connects the first conductive layer via the ring;

a second conductive layer provided on a bottom surface of the substrate;

a plurality of vias provided within the substrate to connect the first conductive layer with the second conductive layer; and a plurality of solder balls provided on the bottom surface of the second conductive layer to connect the second conductive layer with the printed circuit board;

wherein the installation position of individual solder ball is closer to the die cavity in comparison with at least one associated via, therefore when power transfers from individual solder ball through the second conductive layer, at least one associated via, the first conductive layer, and the ring, finally to the die, the direction of current that flow through the second conductive layer is opposite to the direction of current that flow through the first conductive layer, so as that the magnetic field produced by the current flow through the second conductive layer cancels out the magnetic field produced by the current flow through the first conductive layer.

2. The grid array package of claim 1 wherein the die operates under a predetermined internal frequency clock.

3. The grid array package of claim 2 wherein the internal frequency clock is above 100 MHz.

4. The grid array package of claim 1 wherein the die cavity is a recessed die cavity.

5. The grid array package of claim 1 wherein the ring is a power ring.

6. The grid array package of claim 1 wherein the first conductive layer is a power plane.

7. The grid array package of claim 1 wherein the ring is a ground ring.

8. The grid array package of claim 1 wherein a third conductive layer is provided as a power plane between the top surface and the bottom surface of the substrate.

9. The grid array package of claim 1 wherein the installation positions of the ring, individual solder ball and at least one associated via from nearest to farthest, with respect to the die cavity are, the ring, said individual solder ball and said at least one associated via.

10. The grid array package of claim 1 wherein a horizontal distance between the ring and individual solder ball is substantially between 0.6 mm and 2 mm.

11. The grid array package of claim 1 wherein a horizontal distance between individual solder ball and at least one associated via is substantially between 1.0 mm and 2 mm.

* * * * *